United States Patent [19]

Kondoh

[11] Patent Number: 5,691,944
[45] Date of Patent: Nov. 25, 1997

[54] NON-VOLATILE SEMICONDUCTOR MEMORY DEVICE

[75] Inventor: Ichiro Kondoh, Tokyo, Japan

[73] Assignee: NEC Corporation, Tokyo, Japan

[21] Appl. No.: 636,149

[22] Filed: Apr. 22, 1996

[30] Foreign Application Priority Data

Apr. 21, 1995 [JP] Japan .................. 7-096461

[51] Int. Cl.$^6$ ............................................. G11C 7/00
[52] U.S. Cl. ............. 365/189.09; 365/177; 365/181; 365/185.18
[58] Field of Search ............... 365/189.09, 177, 365/185.18, 181

[56] References Cited

U.S. PATENT DOCUMENTS

| | | | |
|---|---|---|---|
| 5,274,590 | 12/1993 | Kashimura | 365/185.18 X |
| 5,329,488 | 7/1994 | Hashimoto | 365/185.18 X |
| 5,544,110 | 8/1996 | Yuh | 365/189.09 X |

FOREIGN PATENT DOCUMENTS 2-94097  4/1990  Japan .

*Primary Examiner*—Do Hyun Yoo
*Attorney, Agent, or Firm*—Sughrue, Mion, Zinn, Macpeak & Seas, PLLC

[57] ABSTRACT

In a non-volatile semiconductor memory device having a writing power source voltage which is supplied thereto exceeding a withstand voltage of a field effect transistor, the object of the present invention is to reduce the number of kinds of field effect transistors constituting the non-volatile semiconductor memory device thereby reducing manufacturing cost. In a non-volatile semiconductor memory device which has a writing circuit 125 for controlling a connection of a writing load to a bit line designated by an output of a column decoder 117 in accordance with a signal of a writing data line 114, and a bias circuit 118 for outputting a bias voltage to set a cell writing voltage of a memory cell array by reducing the writing power source voltage. The semiconductor memory device has an N-type transistor 102 which receives an output of the bias circuit 118 in its gate electrode and outputs a cell writing voltage to a cell writing voltage line 105, and the wiring load constituted of a P-type transistor 104 of a complementary type to that of the N-type transistor 102, the P-type transistor being connected between a cell writing voltage line 105 and a bit line of a memory cell array.

9 Claims, 4 Drawing Sheets

NON-VOLATILE SEMICONDUCTOR MEMORY DEVICE

BACKGROUND OF THE INVENTION

1. Field of the Invention

The present invention relates to a non-volatile semiconductor memory device, more particularly to a non-volatile semiconductor memory device which includes complementary conductivity type field effect transistors.

2. Description of the Related Art

Such kind of non-volatile semiconductor memory device has been heretofore used as a non-volatile semiconductor memory device which is capable of electrically writing information thereinto, the non-volatile semiconductor memory device using a transistor (hereinafter referred to as a memory transistor) which comprises floating and control gates and is capable of electrically writing memory data thereinto. In recent years, some of the non-volatile semiconductor memory devices, so-called flash memories, are capable of electrically writing and erasing information. For example, FIG. 1 is a circuit diagram of a writing circuit used for the non-volatile semiconductor memory device disclosed in Japanese Patent Application Laid-open No. 94098/1990.

The non-volatile memory device shown in FIG. 1 comprises memory cell array 413 which includes a memory transistor having floating and control gates as a memory cell, writing circuit 422 which connects a writing load for a bit line designated by outputs from row and column decoders 423 and 417 which output selection signals for word and bit lines 419 to 421 and 411 and 412 in the memory cell array, and a constant voltage generating circuit 424 which outputs a bias voltage, obtained by decreasing the writing power source voltage, for setting a cell writing voltage of the memory cell.

Furthermore, a writing power source voltage for the non-volatile semiconductor memory device is supplied to writing power source 401. The writing power source has, in general, a value of about 10V. Constant voltage generating circuit 424 comprises P-type MOS transistors 408 and 409 (hereinafter referred to as P-type transistor) connected in series which are arranged between writing power source 401 and normal power source 410. The gates and drains electrodes of the P-type transistors are diode-connected, respectively. The intermediate connection node of the diode-connected transistors outputs the bias voltage to bias voltage line 403. The bias voltage is determined by a writing characteristic of the memory transistors.

Writing circuit 422 consists of a writing control circuit 418, a writing N-type MOS transistor (hereinafter referred to as an N-type transistor) 402, and N-type transistors 404 up to 405 serving as column selectors. The writing control circuit 418 is constituted by an inverter composed of a P-type transistor 406 and an N-type transistor 407 and amplifies a signal from a writing data line 414 to a level of the bias voltage supplied from the bias voltage line 403.

The writing N-type transistor 402, whose gate electrode receives the output from the writing control circuit 418, has a drain electrode connected to the writing power source 401 and a source electrode connected to the drain electrodes of N-type transistors 404 and 405. The respective gate electrodes of the N-type transistors 404 and 405 serving as column selectors are connected to the corresponding outputs 415 and 416 of the column decoder 417, and the source electrodes of the N-type transistors 404 and 405 are connected to the corresponding bit lines 411 and 412.

In the memory cell array 413, word lines 419 up to 421 are connected to the corresponding outputs of the row decoder 423.

FIG. 2 depicts an output characteristic of the source electrode of the writing N-type transistor 402. In FIG. 2, the output current is zero at the output voltage Vbd which is obtained by reducing the bias voltage supplied from the bias voltage line 403 by threshold voltage Vth (at the time of a back gate voltage application).

In the memory cell in which a writing operation is carried out by generating hot carriers in the vicinity of the drain region of the memory cell transistor, a cell writing voltage of 5 to 6V must be applied to a bit line connected to the drain electrode, and the output voltage Vbd in which the output current becomes zero in the output characteristic curve shown in FIG. 2 is utilized as the cell writing voltage Vbd.

When the cell writing voltage Vbd is set at 6V, the bias voltage must be 8V at the time of the threshold voltage Vtn of the memory transistor is 2V. A maximum operation voltage of MOS transistors used in general is 6V, therefore, in order to operate the memory transistor at the voltage of 8V, it is necessary to use a MOS transistor that will withstand high voltage having a thick gate oxide film. The output characteristic curve of FIG. 2 shows a characteristic when writing N-type transistor 402 operates at the constant bias voltage, in which an inclination of the curve can be set at an optimized value for the memory cell by design of the channel width and the channel length of the memory transistor.

A writing operation of the conventional non-volatile semiconductor memory device will be described below.

When a signal on writing data line 414 is at low level, the output of writing control circuit 418 is the bias voltage supplied from bias voltage line 403, which is supplied as the gate voltage of writing N-type transistor 402. At the same time, either N-type transistor 404 or N-type transistor 405 serving as a column selector is selected in response to an address line signal through outputs 415 and 416 of column decoder 417 so that a bit line is selected in response to the selected transistor. Specifically, one of N-type transistors 404 and 405 serving as the column selector, and writing N-type transistor 402 serves as a writing load for the memory cell selected by both of the word and bit lines.

At this time, it is required for the selected bit line to output the cell writing voltage Vbd to the memory cell. Furthermore, a current of about 500 μA is required as the writing current of the memory cell. In order to satisfy the requirements for these cell writing voltage and the writing current, the channel width of N-type transistors 404 and 405 serving as the column selector must be sufficiently large, and the gate voltage of N-type transistors 404 and 405 must be sufficiently high compared to the cell writing voltage Vbd. Therefore, it is necessary to use a high voltage transistor, which is capable of withstanding the high voltage required for writing, for N-type transistors 404 and 405 serving as the column selector and a driving circuit for transistors 404 and 405.

When the signal on writing data line 414 is at a high level, the output of writing control circuit 418 is 0V. Therefore, 0V is supplied to the gate of writing N-type transistor 402 as the gate voltage of transistor 402 so that the cell writing voltage Vbd is not applied to the memory cell selected by the word and bit lines. However, since the voltage from writing power source 401 is still applied to the drain of writing N-type transistor 402, a high voltage is applied between the gate and the drain electrodes of writing N-type transistor 402.

Therefore, a transistor capable of withstanding a high voltage must be used for writing N-type transistor 402.

In order to maintain reliability of an insulating film in a transistor having a gate insulating film, in general, it is necessary to operate the transistor with a sufficiently lower voltage than the inherent insulating withstand value (intrinsic withstand value). The withstand value is based on the value of an electric field applied to the gate insulating film. As for a silicon oxide film used in MOS transistors, it has been known that the MOS transistor has to operate with the gate oxide film being applied with an electric field less than 4 to 5 MeV/cm. In the MOS transistors, a source, a drain, and a voltage applied between a substrate and a gate determine an electric field which is applied to a gate oxide film.

In such a conventional non-volatile semiconductor memory device, a high voltage of about 10V must be used, as a cell writing voltage of a memory cell, on a single semiconductor substrate. For this reason, it has been impossible to ensure sufficient reliability to N and P-type transistors which are operable at 5V, that is, a normal power source voltage so that another N and P-type transistors having thick gate insulating films must be formed on the same semiconductor substrate. Therefore, additional manufacturing processes for these transistors are necessary so that it is impossible to manufacture the memory device at low cost. Furthermore, it is necessary to make a layout where a plurality of transistors having different gate insulating film thicknesses are arranged so that the design work is intricate.

SUMMARY OF THE INVENTION

An object of the present invention is to reduce the number of kinds of transistors constituting a non-volatile semiconductor memory device and to achieve lower cost production in a non-volatile semiconductor memory device which comprises a writing power source supplying a voltage exceeding a withstand voltage of a field effect transistor.

Another object of the present invention is to provide a non-volatile memory device which comprises a memory cell array consisting of a plurality of transistors, each of which is capable of electrically writing data thereto, as a memory cell; a writing circuit which controls, in response to a writing data input signal, the connection of a writing load to a bit line designated by outputs from row and column decoders which decode address signals to output selection signals for word and bit lines of the memory cell array; and a bias circuit which outputs a bias voltage for setting a cell writing voltage of the memory cell by lowering a writing power source voltage, the non-volatile semiconductor device further comprising a field effect transistor (102, 302) which receives an output signal from the bias circuit in its gate electrode and outputs the aforementioned cell writing voltage to a cell writing voltage line connected to its source electrode, and a field effect transistor (104, 304) of a conductivity type complementary to that of the transistor (102, 302) which is said writing load arranged between the cell writing voltage line and the bit line of the memory cell array.

A non-volatile semiconductor memory device wherein the writing load is composed of an field effect transistor which is turned ON/OFF in response to a logic product of said writing data input signal is a preferable embodiment of the present invention.

A non-volatile semiconductor memory device wherein the writing load is two field effect transistors connected in series which are separately turned ON/OFF in response to an output signal from the column decoder and the writing data input signal is also a preferable embodiment of the present invention.

A non-volatile semiconductor memory device wherein the turning on/off operation of one of the two field effect transistors (304) is controlled by an output signal of the writing data input signal and that of the other field effect transistor (326) is controlled in the same way by an output signal of the column decoder.

Still another object of the present invention is to provide a data writing method of a non-volatile semiconductor memory device. The data writing method is used in having a non-volatile semiconductor device to a memory cell array using a transistor as a memory cell to which data is electrically written.

The improvement comprises the steps of: outputting a writing voltage; outputting a bias voltage lower than the writing voltage; selecting a bit line by a writing data input signal and a column designation signal from a column decoder; and transmitting the bias signal to the bit line selected by the writing voltage.

A data writing method of a non-volatile semiconductor memory device described above wherein the step for outputting the writing voltage is the step in which the writing voltage is output through an N-type field effect transistor, the drain electrode of which is supplied with a writing power source voltage, the gate electrode of which is supplied with half of the writing power source voltage, and the source electrode of which is supplied with the writing voltage obtained by reducing the writing power source voltage. The step of outputting a bias voltage lower than said power source voltage is the step of outputting a voltage obtained by reducing the writing power source voltage. The step for selecting the bit line is the step of selecting said bit line by a logic product signal of a writing data signal and a column designation signal from the column decoder. The step of connecting said writing voltage to the selected bit line is the step for outputting the writing voltage by a P-type field effect transistor, the source electrode of which is connected to the writing voltage, the drain electrode of which is connected to the bit line, and the gate electrode of which is connected to the bias voltage only when said bit line is selected. In an alternative embodiment, the data writing method above has steps wherein the step for outputting said writing voltage is the step in which said writing voltage is output through an N-type field effect transistor, the drain electrode of which is supplied with a writing power source voltage, the gate electrode of which is supplied with half of the writing power source voltage, and the source electrode of which is supplied with half of the writing voltage obtained by reducing the writing power source voltage. The step of outputting a first bias voltage lower than the writing power source voltage is the step of outputting a voltage obtained by reducing the writing power source voltage. The step of selecting the bit line is the step of applying a bit line designation signal from the column decoder to the gate electrode of a selection P-type field effect transistor, the drain electrode of which is connected to the bit line. The step of connecting the writing voltage to the selected bit line is the step of connecting the source electrode of the selection P-type field effect transistor for bit line selection to the drain electrode of a writing P-type field effect transistor, the gate electrode of which is supplied with a second bias voltage at the time writing data is input and the source electrode of which is supplied with a cell writing voltage.

BRIEF DESCRIPTION OF THE DRAWINGS

Further objects and advantages of the present invention will be apparent from the following description, reference being made to the accompanying drawings wherein preferred embodiments of the present invention are clearly shown.

In the drawings.

DETAILED DESCRIPTION OF THE PREFERRED EMBODIMENTS

Figure 3:
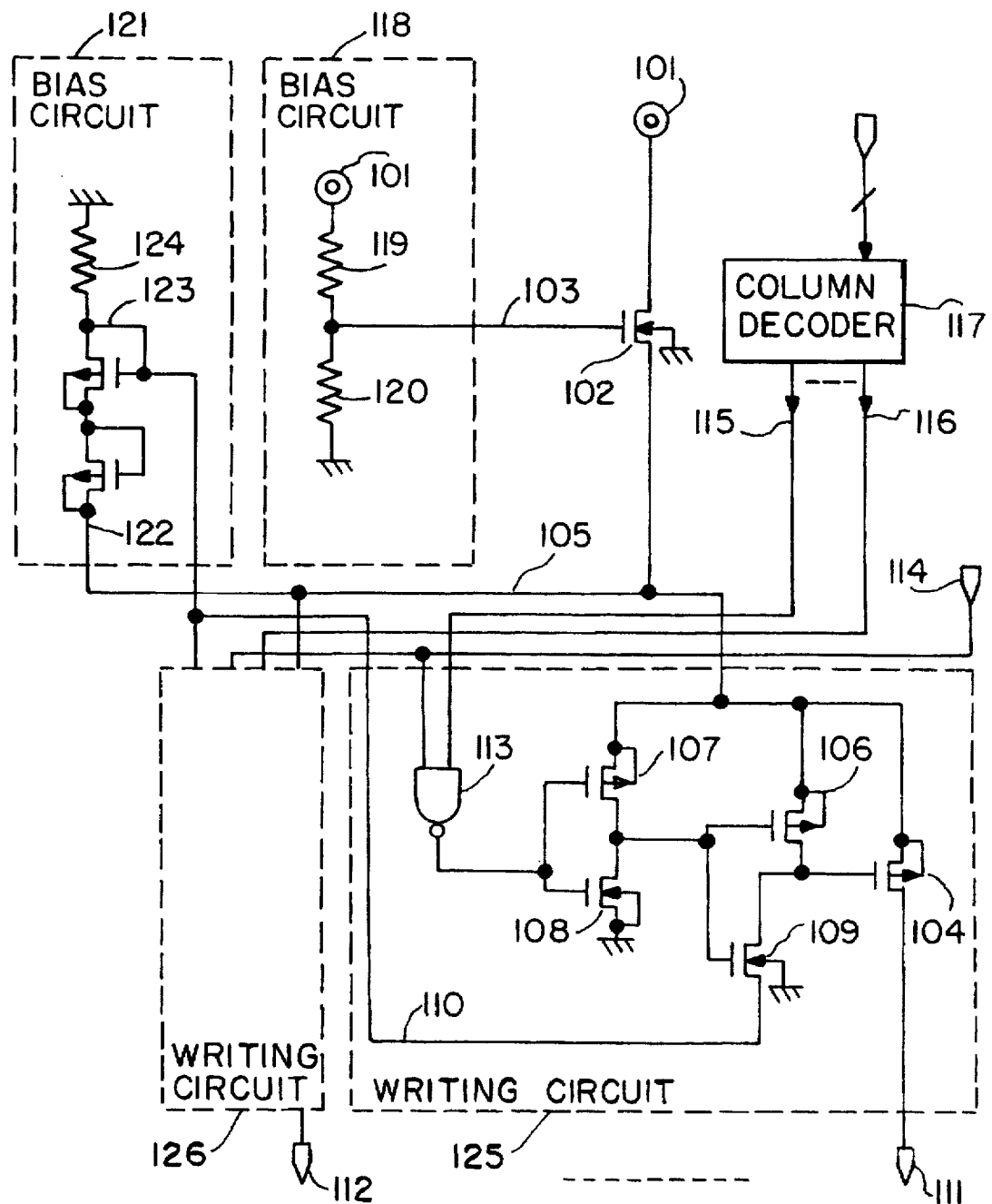
FIG. 3 is a circuit diagram showing a periphery of a writing circuit in a non-volatile semiconductor memory device of the present invention.

FIG. 3 is a circuit diagram showing a first embodiment of a periphery of a writing circuit in a non-volatile semiconductor memory device of the present invention.

The periphery of the writing circuit in the non-volatile semiconductor memory device of the first embodiment consists of column decoder 117 which outputs a selection signal for a bit line of a memory cell array in accordance with address signals, writing circuit 125 which controls the connection of a writing load to the bit line designated by the selection signal from column decoder 117 in accordance with a signal from writing data line 114, bias circuit 118 which outputs a bias voltage for setting a cell writing voltage of the memory cell, the bias voltage being obtained by reducing a writing power source voltage, N-type transistor 102 which receives an output signal from bias circuit 118 in its gate electrode and outputs the cell writing voltage to cell writing voltage line 105 connected to its source electrode, and P-type transistor 104 having an opposite type to N-type transistor 102 serving as a writing load, connected between cell writing voltage line 105 and the bit line of the memory cell array.

Bias circuit 118 operates by writing power source 101 and consists of resistors 119 and 120 connected in series, whose intermediate connection point is connected to bias voltage line 103 to output a bias voltage.

N-type transistor 102 has the gate electrode connected to bias voltage line 103 and the drain electrode connected to writing power source 101. N-type transistor 102 outputs a cell writing voltage lower than the supply voltage of writing power source 101 from the source electrode thereof to cell writing voltage line 105.

Writing circuits 125 and 126 are arranged every bit line, and circuits 125 and 126 are constituted as follows. Circuits 125 and 126 operate with the cell writing voltage.

An output from NAND gate 113 which receives output 115 of column decoder 117 and writing data 114 is input to the gate electrode of P-type transistor 104 through two inverters. One inverter consists of transistors 107 and 108, and the other inverter consists of transistors 106 and 109. P-type transistor 104 has the drain electrode connected to bit line 111, which determines the writing characteristic of the memory cell. The source electrodes of transistors 104, 107, and 108 are connected to cell writing voltage line 105, and the source electrode of N-type transistor 109 is connected to bias voltage line 110.

Bias circuit 121 consists of P-type transistors 122 and 123, and resistor 124, which are connected in series. The gate and drain electrodes of transistors 122 and 123 are connected, and the resistance value of resistor 124 is larger than the equivalent resistance value of transistors 122 and 123. Bias circuit 121 operates with cell writing voltage 105 to output a bias voltage to bias voltage line 110. The bias voltage is obtained by reducing the cell writing voltage by two times of the threshold voltage Vtp of the P-type transistor.

N-type transistor 102, writing circuit 125, bias circuits 118 and 121, and column decoder 117 described above are arranged in the same semiconductor substrate where the memory cell array is formed.

An operation of the periphery of the writing circuit in the non-volatile semiconductor memory device of the first embodiment will be described with reference to FIG. 3. In the non-volatile semiconductor memory device of the first embodiment, the voltage of 10V is supplied to writing power source 101. The cell writing voltage is 6V as described in the description for the prior art. Specifically, the source voltage of N-type transistor 102 is 6V. When it is supposed that the threshold voltage Vtn is 2V at the time of the application of the backgate voltage, the bias voltage of bias circuit 118 is determined so as to be 6V+Vtn. Hence, the bias voltage of bias circuit 118 is 8V. Therefore, a voltage exceeding 6V is not applied to the drain electrode, the source electrode, and between the substrate and the gate electrode.

As described in the description for the prior art, a current value of about 500 μA is required for the writing current per one bit. When the cell writing voltage is fetched from the source electrode of N-type transistor 102 and a transistor width of N-type transistor 102 is set to an appropriate size, the reduction of the cell writing voltage at the time of the writing operation can be minimized sufficiently, even when a large amount of writing current is necessary. Furthermore, N-type transistor 102 may be arranged with only one transistor for each of the writing circuits because the N-type transistor does not depend on an address signal and writing data.

When output 115 of column decoder 117 is high level, writing circuit 125 is selected, and other writing circuits are not selected. Furthermore, when the signal of writing data line 114 is high level, the output from NAND gate 113 is rendered low level so that the gate voltages of transistors 106 and 109 are rendered high level. Thus, since P-type transistor 106 is turned-off and N-type transistor 109 is turned-on, the output voltage of bias circuit 121 is transmitted to the gate electrode of P-type transistor 104 serving as the writing P-type transistor. Therefore, P-type transistor 104 is turned-on to output the cell writing voltage to the bit line. Thus, data writing to the memory cell is performed.

When the signal of writing data line 114 is low level, the output of NAND gate 113 is rendered high level so that the gate voltages of transistors 106 and 109 are rendered low level. Thus, since P-type transistor 106 is turned-on and N-type transistor 109 is turned-off, the gate voltage of P-type transistor 104 is rendered high level. Therefore, P-type transistor 104 is turned-off so that the cell writing voltage is not supplied to the bit line from the transistor 104. As a result, data writing to the memory cell is not performed.

When output 115 of column decoder 117 is low level, writing circuit 125 is not selected, and another writing circuit is selected. In this case, an operation of writing circuit 125 is the same as that in the case where the signal of writing data line 114 is low level.

Therefore, a description of the operation of writing circuit 126 is omitted.

As described above, since writing circuits 125 and 126 operate with the cell writing voltage, writing circuits 125 and 126 never operate with supply voltage 10V supplied to writing power source 101.

Therefore, as the whole of the non-volatile semiconductor memory device of this embodiment, the semiconductor memory device operates with the supply voltage 10V supplied to writing power source 101, and in the transistors including N-type transistor 102 shown in FIG. 3, the voltage exceeding the power source voltage is not usually applied to the source electrode, the drain electrode, and between the substrate and the gate electrode.

Hereupon, it is proper that logic gate 113 and column decoder 117 should operate with the cell writing voltage.

Figure 1:
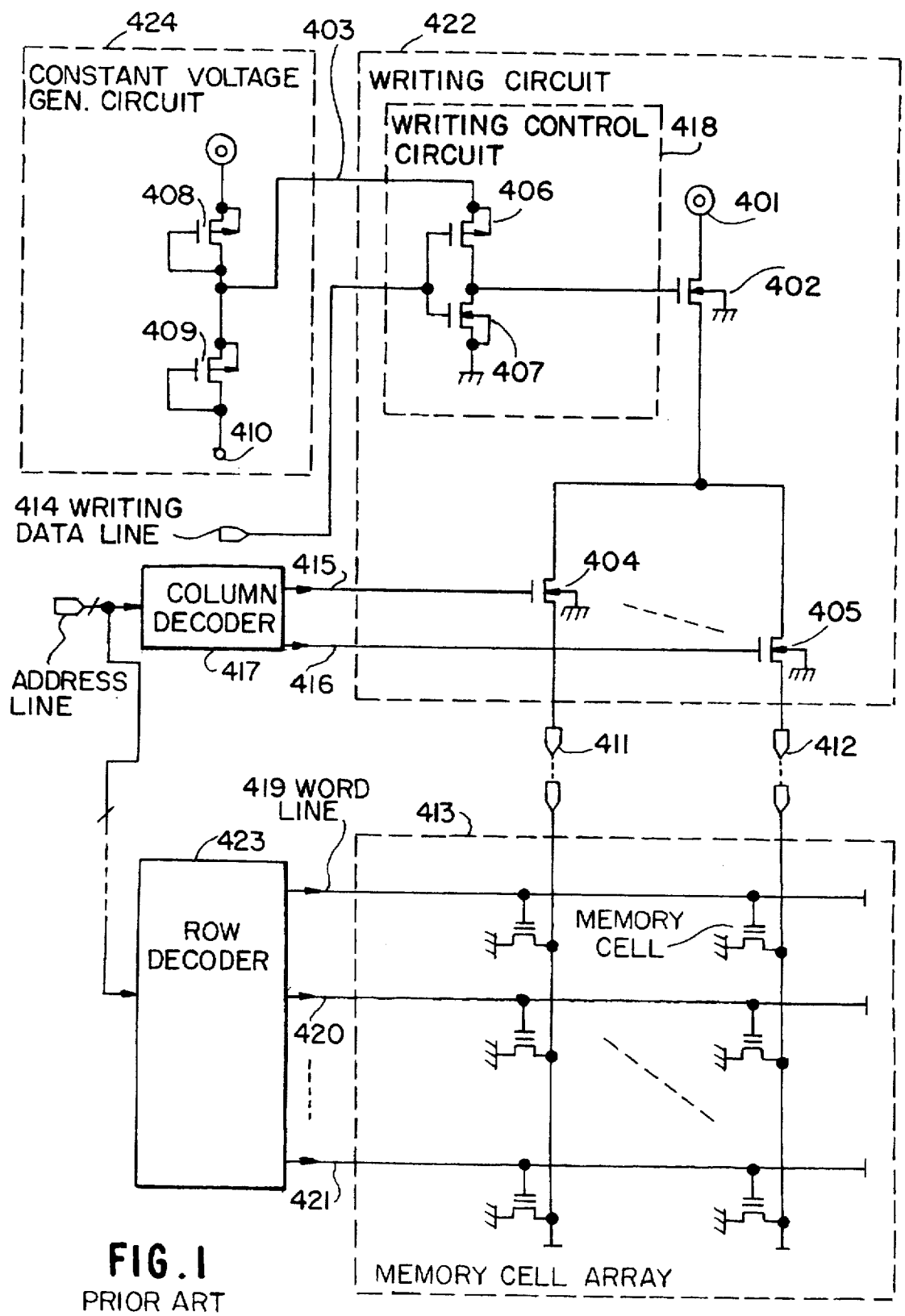
FIG. 1 is a circuit diagram showing a writing circuit of a conventional non-volatile semiconductor memory device.
Figure 2:
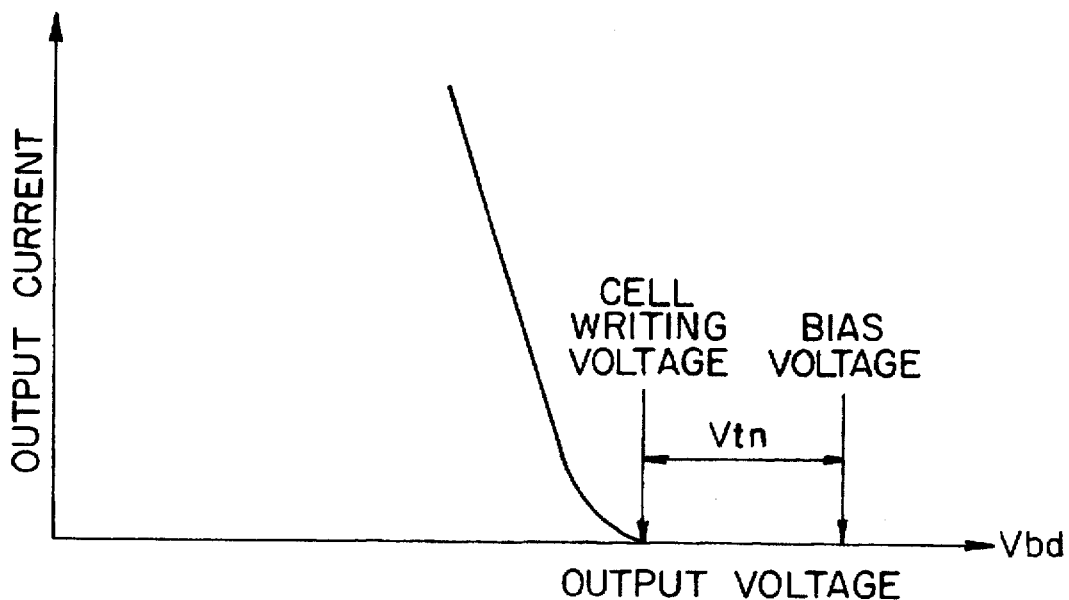
FIG. 2 is a diagram showing an output characteristic of writing N-type field effect transistor 402 shown in FIG. 1.
Figure 4:
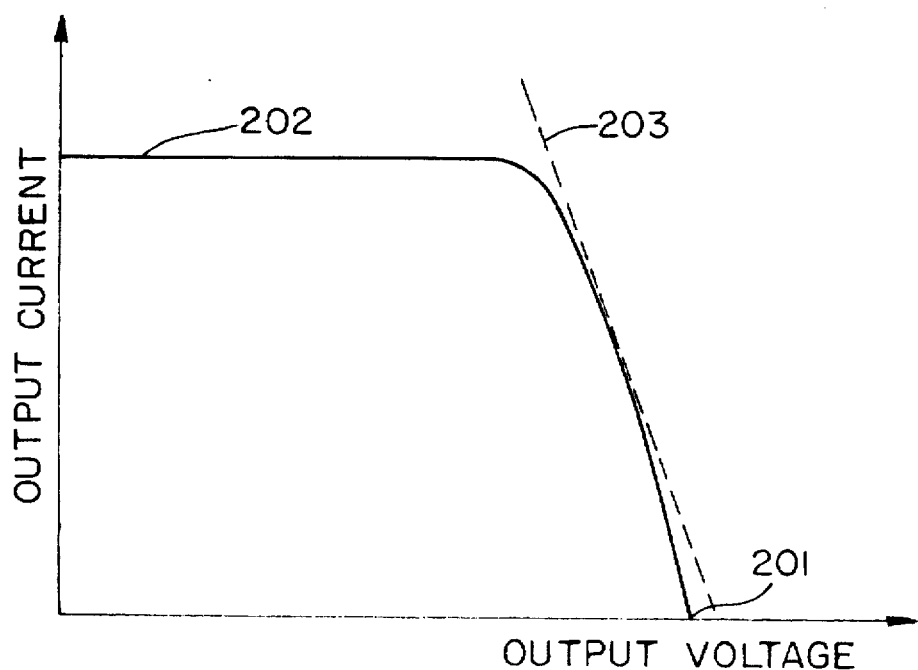
FIG. 4 is a diagram showing an output characteristic of writing P-type transistor 104 shown in FIG. 3.

FIG. 4 is a diagram showing an output characteristic of writing N-type transistor 104 in this embodiment. Referring to FIG. 4, straight line 203 shown by the broken line corresponds to the inclination of the characteristic curve of the conventional writing N-type transistor in FIG. 2, which can be designed with the channel width of P-type transistor 104. Furthermore, the value of saturation current 202 is determined by the output of bias circuit 121, and the current control function is exhibited by the saturation current of the P-type transistor determined by the gate voltage. Output voltage 201 on the axis of abscissas shows the cell writing voltage Vbd.

Figure 5:
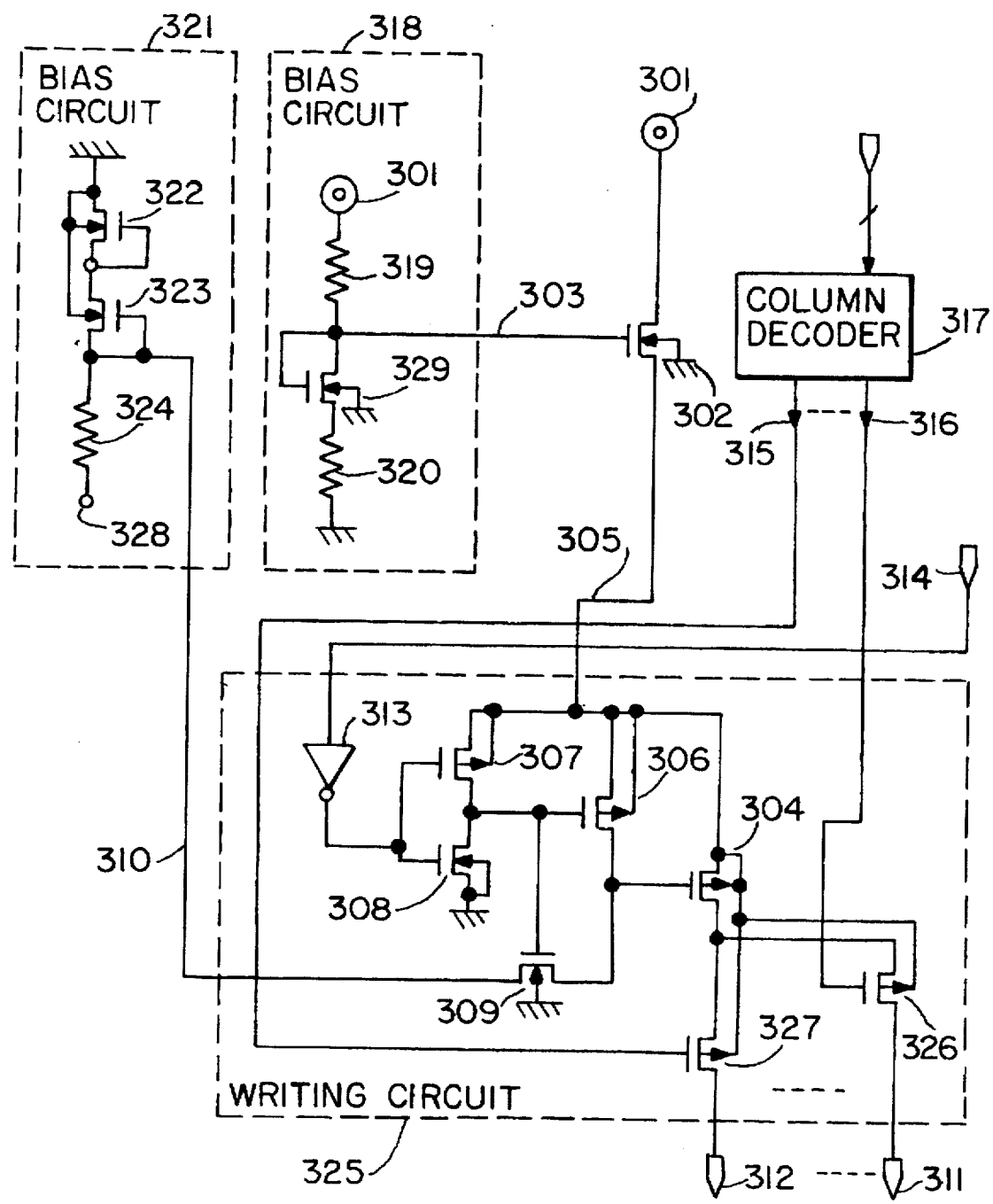
FIG. 5 is a circuit diagram showing a second embodiment of a periphery of a writing circuit of a non-volatile semiconductor memory device of the present invention.

FIG. 5 shows a second embodiment of a periphery of a writing circuit in a non-volatile semiconductor memory device of the present invention. Referring to FIG. 5, the periphery of the writing circuit of the non-volatile semiconductor memory device of this embodiment comprises column decoder 317, bias circuits 318 and 321, N-type transistor 302, and writing circuit 325.

Bias circuit 318 operates with writing power source 301. Bias circuit 318 consists of resistors 319 and 320, and N-type transistor 329 having gate and drain electrodes connected with each other, and those transistors are connected in series. The intermediate connection point between resistor 319 and transistor 329 serving as a bias voltage source is connected to a bias voltage line 303. When the bias circuit 318 is constituted in such form, the source voltage of transistor 329 is approximately equal to a voltage of cell writing voltage line 305.

N-type transistor 302 has the drain electrode connected to writing power source 301 and the gate electrode connected to bias voltage line 303 which receives the bias voltage generated by bias circuit 318. The N-type transistor 302 provides a cell writing voltage lower than the writing power source voltage from writing power source 301 to cell writing voltage line 305.

Writing circuit 325 is arranged one circuit for a group of bit lines 311 up to 312. Writing circuit 325 is constituted as follows and operates with the cell writing voltage.

The internal constitution of writing circuit 325 will be described. Outputs of column decoder 317 are connected to the gate electrodes of P-type transistors 326 and 327 serving as column selectors, respectively. The output of inverter 313 which is supplied with the signal from writing data line 314 is connected to the gate electrode of P-type transistor 304 through two inverters. One inverter consists of transistors 307 and 308, and the other, transistors 306 and 309. P-type transistor 304 serves to determine the writing characteristic of the memory cell. The drain electrode of transistor 304 is connected to bit lines 311 and 312 through P-type transistors 326 and 327. The gate electrode of P-type transistor 304 is connected to bias voltage line 310 serving as an output line of bias circuit 321 through N-type transistor 309.

Hereupon, bias circuit 321 operates with normal power source voltage 328, and consists of N-type transistors 322 and 323 and resistor 324 connected in series. The gate and drain electrodes of N-type transistors 322 and 323 are connected, respectively, and resistor 324 has a higher resistance than the equivalent resistance of N-type transistors 322 and 323. Bias circuit 321 outputs a bias voltage to bias voltage line 310, the bias voltage being higher than the ground voltage by two times the threshold voltage of the N-type transistor.

N-type transistor 302, writing circuit 325, bias circuit 318, and column decoder 317 which are described above are arranged in the same semiconductor substrate in which the memory cell is arranged.

An operation of the periphery of the writing circuit in the non-volatile semiconductor memory device of this embodiment will be described with reference to FIG. 5. In the non-volatile semiconductor memory device of this embodiment, a voltage of 10V is supplied to writing power source 301 in the same manner as the first embodiment.

The value of the cell writing voltage is 6V as described in the description for the prior art. Specifically, the source voltage of N-type transistor 302 is 6V. When the threshold voltage Vtn of the transistor is assumed to be 2V at the time of the application of the backgate voltage, the bias voltage of bias circuit 318 is determined so as to be 6V+Vtn so that the bias voltage is 8V. Therefore, a voltage exceeding 6V is not applied to the drain electrodes, the source electrodes of N-type transistors 302 and 329, and between the substrate and the gate electrode of the transistors 302 and 329.

When output 316 of column decoder 317 is low level, P-type transistor 326 serving as a column selector is selected, and other P-type transistors are not selected. Furthermore, when the signal of writing data line 314 is high level, the output of inverter 313 is rendered low level so that the gate voltages of transistors 306 and 309 are rendered high level. Since P-type transistor 306 is turned-off and N-type transistor 309 is turned-on, the output voltage of bias circuit 321 is transmitted to the gate electrode of P-type transistor 304 serving as a writing P-type transistor. P-type transistor 304 is turned-on so that the cell writing voltage is output to bit line 311 selected by P-type transistor 326 serving as the column selector. Thus, data writing to the memory cell is performed.

When the signal of writing data line 314 is low level, the output of the inverter 313 is rendered high level so that the gate voltages of the transistors 306 and 309 are rendered low level. Since P-type transistor 306 is turned-on and N-type transistor 309 is turned-off, the gate voltage of P-type transistor 304 is rendered high level. The P-type transistor 304 is turned-off so that the cell writing voltage is not output to bit line 311. Data writing to the memory cell is not performed.

When output 315 of column decoder 317 is low level, P-type transistor 326 serving as the column selector is not selected, and another P-type transistor 327 is selected. Therefore, the cell writing voltage is not outputted to bit line 311. Data writing to the memory cell is not performed.

Also in the embodiment shown in FIG. 5, the output characteristic as the writing load has the feature as shown in FIG. 4. However, the inclination of the characteristic curve in FIG. 4 is obtained by combining the characteristic of writing transistor 302 and P-type transistor 326 and 327 serving as the column selector. Therefore, it is necessary to make the transistor width larger rather than obtaining approximately the same inclination as that of the first embodiment. However, installation of a plurality of writing circuits is not necessary. Furthermore, Vbd in FIG. 4 is reduced to be smaller than the cell writing voltage by the voltage difference between the source and drain electrodes of the column selector. However, since the reduced value of Vbd is small, the cell writing voltage can be set larger previously so as to compensate the reduced value of Vbd. Saturated current value 202 shown in FIG. 4 is determined by the output of bias circuit 321 and serves to limit the current.

As described above, since writing circuit 325 operates with the cell writing voltage, writing circuit 325 never operates with the supply voltage 10V supplied to writing circuit 301.

Therefore, however the whole of the non-volatile semiconductor memory device of this embodiment operates with the supply voltage 10V supplied to the writing circuit 301, in the transistors including N-type transistor 302 shown in FIG. 5, the voltage exceeding the power source voltage is not usually applied to the source electrode, the drain electrode, and between the substrate and the gate electrode.

Although, however the voltages applied to inverter 313 and column decoder 317 for these operations are not clearly shown, inverter 313 and column decoder 317 should be preferably operated with the cell writing voltage.

The writing circuit described above can be used widely for writing circuits of non-volatile semiconductor memory cells which generate generally hot carriers to operate data writing. Furthermore, in the description of the embodiments described above, voltage reducing means which uses the N-type transistor receiving a proper gate bias is described for achieving the most simplicity. However, the present invention is not limited to these embodiments.

As described above, the non-volatile semiconductor memory device of the present invention comprises a field effect transistor for outputting a cell writing voltage to a cell writing voltage line, and a writing load arranged between the cell writing line and a bit line of a memory cell array is constituted of a field effect transistor having the opposite conductivity type to that of the field effect transistor for outputting the cell writing voltage. Therefore, a writing circuit for control of the writing load and the peripheral circuit thereof can operate with a voltage lower than the cell writing voltage so that new formations of N-type and P-type transistors having thick insulating films on the semiconductor substrate where the aforementioned transistors are formed are not necessary. As a result, manufacturing steps are simplified so that the non-volatile semiconductor memory device of the present invention can be manufactured inexpensively.

Furthermore, it is not necessary to design the layout for arrangements of the transistors having the gate insulating films of different thicknesses, whereby the design work is simplified.

Although particular embodiments of the present invention have been shown and described, it will be obvious to those skilled in the art that various changes and modifications may be made without departing from the spirit and scope of the present invention.

What is claimed is:

1. A non-volatile semiconductor memory device comprising:
   a memory cell array which consists of a plurality of transistors each of which is capable of being written electrically with data as a memory cell;
   a writing circuit which controls a connection of a writing load to a bit line in accordance with a combination of a writing data input signal and a column designation signal, said bit line being designated by outputs from a column decoder which decodes address signals to output said column designation signal for the bit line of said memory cell array; and
   a bias circuit which outputs a bias voltage to set a cell writing voltage of said memory cell array by reducing a writing power source voltage;
   said non-volatile semiconductor memory device further comprising:
      a first field effect transistor which receives the output bias voltage of said bias circuit in its gate electrode, and outputs said cell writing voltage to a cell writing voltage line connected to its source electrode; and
      a second field effect transistor, of a conductivity type complementary to that of said first field effect transistor, for connecting said writing load, said second field effect transistor being arranged between said cell writing voltage line and the bit line of said memory cell array.

2. The non-volatile semiconductor memory device according to claim 1, wherein said writing circuit is composed of said second field effect transistor having a turning-on/off operation of which is controlled in accordance with a logic product of an output signal of said column decoder and said writing data input signal.

3. The non-volatile semiconductor memory device according to claim 1, wherein said writing circuit is composed of said second field effect transistor and a third field effect transistor connected in series, each having a turning-on/off operation which is separately controlled in accordance with an output signal of said column decoder and said writing data input signal.

4. The non-volatile semiconductor memory device according to claim 3, wherein the turning on/off operation of said second field effect transistor is controlled by said writing data input signal and the turning on/off operation of said third field effect transistor is controlled by said column designation signal output by the column decoder.

5. A data writing method of a non-volatile semiconductor memory device to a memory cell array which consists of a plurality of transistors each of which is capable of being electrically written with data as a memory cell comprising the steps of:
   outputting a writing voltage;
   outputting a first bias voltage lower than a writing power source voltage;
   selecting a bit line to receive said writing voltage by providing a writing data input signal and a column designation signal from a column decoder, by applying said column designation signal from the column decoder to a gate electrode of a bit line selection P type field effect transistor, a drain electrode of which is connected to the bit line; and
   connecting the selected bit line to said writing voltage when a selection of said bit line is set, by connecting a source electrode of said bit line selection P-type field effect transistor to a drain electrode of a writing P-type field effect transistor, a gate electrode of said writing P-type field effect transistor being applied with a second bias voltage, and a source electrode of said writing P-type field effect transistor being applied with the writing voltage when said writing data input signal is applied.

6. The data writing method of the non-volatile semiconductor memory device according to claim 5, wherein the step of outputting said writing voltage comprises the step for outputting said writing voltage through an N-type field effect transistor, a drain electrode of which is connected to the writing power source voltage, a gate electrode of which is connected to a half of the writing power source voltage, and a source electrode of which is connected to the writing voltage obtained by reducing the writing power source voltage; and the step of outputting the first bias voltage lower than said writing power source voltage comprises the step of outputting the first bias voltage which is obtained by reducing the writing power source voltage.

7. The data writing method of the non-volatile semiconductor memory device according to claim 5, wherein the step of selecting said bit line comprises the step of selecting said bit line by a logic product of the writing data input signal and said column designation signal from said column decoder; and the step of connecting the selected bit line to said writing voltage comprises the step of outputting the writing voltage to said selected bit line only when said writing P-type field effect transistor is connected at its said gate electrode to the second bias voltage by said bit line being selected.

8. A data writing method of a non-volatile semiconductor memory device to a memory cell array which consists of a plurality of transistors each of which is capable of being electrically written with data as a memory cell comprising the steps of:

outputting a writing voltage;

outputting a first bias voltage lower than a writing power source voltage;

selecting a bit line to receive said writing voltage, by providing a writing data input signal and a column designation signal from a column decoder by applying a logic product of the writing data input signal and said column designation signal from said column decoder; and connecting the selected bit line to said writing voltage when a selection of said bit line is set, by outputting the writing voltage to said selected bit line only when a P-type field effect transistor, whose source electrode is connected to the writing voltage and whose drain electrode is connected to the bit line, is connected at its gate electrode to a bias voltage by said bit line being selected.

9. The data writing method of the non-volatile semiconductor memory device according to claim 8, wherein the step of outputting said writing voltage comprises the step of outputting said writing voltage through an N-type field effect transistor, whose drain electrode is connected to the writing power source voltage, whose gate electrode is connected to a half of the writing power source voltage, and whose source electrode is connected to the writing voltage obtained by reducing the writing power source voltage; and the step of outputting the first bias voltage lower than said writing power source voltage comprises the step for outputting the first bias voltage which is obtained by reducing the writing power source voltage.

* * * * *